United States Patent [19]

Henry

[11] Patent Number: 4,736,235

[45] Date of Patent: Apr. 5, 1988

[54] ULTRA-HIGH FREQUENCY DIODE STRUCTURE WHOSE EXTERNAL CONNECTIONS ARE PROVIDED BY TWO METAL BEAM LEADS

[75] Inventor: Raymond Henry, Fontenay Aux Roses, France

[73] Assignee: Thomson-CSF, Paris, France

[21] Appl. No.: 898,855

[22] Filed: Aug. 20, 1986

Related U.S. Application Data

[63] Continuation of Ser. No. 552,069, Nov. 15, 1983, abandoned.

[30] Foreign Application Priority Data

Nov. 16, 1982 [FR] France ............... 82 19142

[51] Int. Cl.[4] .................. H01L 23/48; H01L 23/10
[52] U.S. Cl. ........................ 357/69; 357/68
[58] Field of Search ............ 357/69, 68, 67, 81; 25/578

[56] References Cited

U.S. PATENT DOCUMENTS 3,105,922 10/1963 Fukai et al. .............. 357/76
3,183,407 11/1965 Yasuda et al. ............ 357/75
4,189,342 2/1980 Kock ......................... 29/578
4,190,854 2/1980 Redfern ..................... 357/67

FOREIGN PATENT DOCUMENTS 1031890 6/1966 United Kingdom .

OTHER PUBLICATIONS

"Design and Manufacture of a Microwave Low-Noise Transistor Having Beam-Leads"-Pestie et al-IEEE Trans. on Elec. Devices,-vol. Ed-24, No. 2, Feb. 1977, pp. 73-79.

Primary Examiner—Martin H. Edlow
Assistant Examiner—S. V. Clark
Attorney, Agent, or Firm—Oblon, Fisher, Spivak, McClelland & Maier

[57] ABSTRACT

A diode structure having connections utilizing beam leads as disclosed wherein two beam-leads are spaced apart by a diode chip and by a glass stud which is spaced away from the diode chip. Contacts are taken from the diode on its two main faces. One of the two lead-beams is formed in two separated parts in order to provide for an assembly of two metal portions and of a glass stud which forms three adjustable coupling capacitors.

2 Claims, 3 Drawing Sheets

ULTRA-HIGH FREQUENCY DIODE STRUCTURE WHOSE EXTERNAL CONNECTIONS ARE PROVIDED BY TWO METAL BEAM LEADS

This application is a continuation of application Ser. No. 552,069, filed Nov. 15, 1983, now abandoned.

BACKGROUND OF THE INVENTION

FIELD OF THE INVENTION

The present invention relates to the structure of a diode whose external connections are provided through beam-leads; this structure being adopted for reducing the parasite capacities during operation in the ultra-high frequency range, whereas the robustness of the diode is improved. The invention relates essentially to ultra-high frequency diodes, for it is at very high frequencies that the following problems occur:
  parasite capacity between metal beams,
  parasite inductances with the external connections.

The structure of the invention is suitable for all types of diodes: pn junction, PIN or Schottky diodes, but it is especially PIN and Schottky diodes which are concerned.

DISCUSSION OF BACKGROUND

In ultra-high frequency circuits, it is very often diodes whose external connections are provided by beams which are used: they are better known internationally as beam-leads. The beams have less parasite inductance than soldered gold wires but, since they rest on the surface of the didoe pastille, a capacity is formed between the two beams through the conducting substrate. There is then an opposition between the requirement of having a diode junction and small beams, for reducing the parasite capacities and the requirement of having beams of large section for minimizing the parasite inductances. A known solution to this problem consists in resting the beams on a glass ring which surrounds the diode pastille, this latter being suspended from the center of the ring by two beams. However, this structure is not well adapted to high heat dissipation and the glass has a dielectric constant which is still too high, which means that there remains a parasite capacity which is still too high.

SUMMARY OF THE INVENTION

According to the invention, the beams are no longer laid on the same face of the diode pastille, which means that the pastille must be fairly large to form a mechanical support. The beams, parallel with respect to each other, are fixed on each side of the pastille on the two opposite faces. To improve the strength of the assembly, one of the two beams is extended and thus becomes parallel to the other beam: a glass stud connects the two beams together without there being lateral contact between the glass stud and the junction of the diode. The structure comprises then two metal beams, spaced apart by a diode pastille and a glass stud or more generally by a dielectric stud.

More precisely, the invention relates to a diode structure operating at ultra-high frequencies, whose external connections are provided by two metal beams, wherein the diode pastille is mounted between the two beams, a first beam being in contact with a first main face of the diode pastille and a second beam in contact with a second main face of the diode pastille, the two beams being parallel to each other and spaced apart by a glass stud, separate from the diode pastille.

BRIEF DESCRIPTION OF THE DRAWINGS

The invention will be better understood from the description of examples of diode structures in accordance with the invention as well as from the description of the process for manufacturing such diodes, these structures and the process being illustrated by accompanying figures which show.

DESCRIPTION OF THE INVENTION

Figure 1:
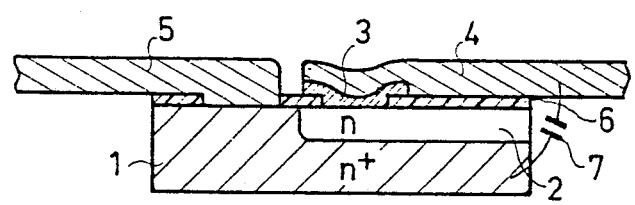
FIG. 1: a beam-lead diode of the prior art.

FIG. 1 shows a beam-lead diode of the prior art. A substrate 1, which in the case illustrated is of n+ type, supports a junction between an n layer 2 and a metal giving a Schottky barrier 3. The contacts taken from this Schottky diode are provided by two lead beams, the anode beam 4 on the Schottky metal 3 and the cathode beam 5 on the n+substrate. Sine these beams are lying on the surface of the Schottky diode pastille, it is necessary for the anode beam 4 to be insulated from the n layer 2 by an insulating layer 6, this latter being frequently a doped silica layer, so glass, which has a dielectric constant greater than air.

When such a diode is designed for working at ultra-high frequencies, and whether it is of junction type, Schottky type of PIN type, the capacity of the junction which forms the diode must be small, which means that its surface must be small. Thus, by way of example, at 16 GHz, the diameter of the Schottky contact is of the order of 5 microns and at 94 GHz, the diameter of this same contact is of the order of 2 microns. For a PIN diode, with a thin practically intrinsic I zone (2 to 3 microns), the diameter of the junction at 94 GHz is of the order of 15 microns. The smaller the diameter of the junction, projected on the free surface of the diode pastille, the greater and more troublesome the surface of the insulating layer 6 becomes because of the parasite capacity formed by the anode beam 4 acting as first plate, the thin insulating layer 6 and the n type layer 2 acting as conductor, as well as the cathode beam 5 and the n+ substrate 1 acting as second plate.

In addition, the series inductance presented by the metal connections formed by the beams must be minimized, i.e. the beams must have a large section. The section of the beams is obtained in particular by forming beams wider than they are thick, which leads to a between beam parasite capacity, through the interposed substrate, which is inacceptable because it tends to short-circuit the junction. In FIG. 1, the parasite capacitor 7 has been shown by the symbolic diagram of a capacitor between anode beams 4, the n layer and substrate 1: if this capacitor has too high a value it short-circuits the diode junction. An improvement of the structure of diodes for avoiding the presence of parasite capacities is revealed in U.S. patent application Ser. No.

81, 23,027 dated 9th Dec. 1981 in the name of the present Applicant.

Figure 2:
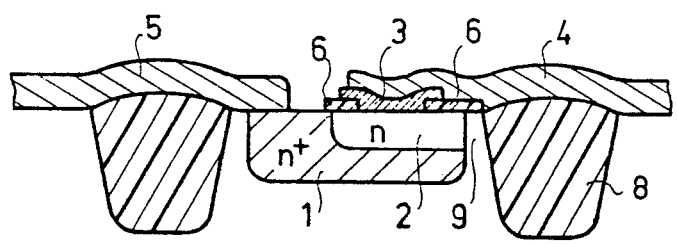
FIG. 2: a beam-lead of the prior art, in an improved version.

FIG. 2 shows a sectional view of a beam-lead diode in accordance with this patent application.

The diode pastille is again, as in FIG. 1, formed by an n+ substrate 1, an n layer 2 and a Schottky contact 3. The anode beam 4 makes contact with the Schottky metal 3 and the cathode beam 5 makes contact with the substrate 1. But, in this improvement, the diode pastille is limited to a minimum surface around the active junction: the mechanical support which the surface of the pastille represents for the two beam-lead beams is replaced by a glass ring 8 which surrounds the diode pastille and on which the beams rest. Thus, the diode pastille is suspended from the center of the ring by the two metal beams, without there being lateral contact between the thicknesses of semiconductor materials n+ and ni, and the parasite capacitor is limited by the small area of the insulation 6 which surrounds the Schottky contact 3. The parasite capacitor formed by the anode beam 4, the glass ring 8 and the n+substrate 1 has in addition a greatly reduced value because of the presence of a blade of air 9 which separates the diode pastille from the glass ring 8.

Although the use of such glass caissons is advantageous, there still remain however two drawbacks:

the dielectric constant of the glass is relatively high, from 6 to 12 depending on the case, and the parasite capacity remains troublesome, especially above 30 GHz. The presence of an air capacity reduces the parasite capacity between beam 4 and substrate 1 but, considering the extremely small dimensions of ultra-high frequency diodes, the blade of air 9 is also extremely small and consequently reduces the value of the parasite capacity less than could be desired.

This process in which the diode pastille is suspended inside a glass ring is not well adapted to high heat dissipation, which is required in some cases with avalanche diodes or some switching diodes for example.

Figure 3:
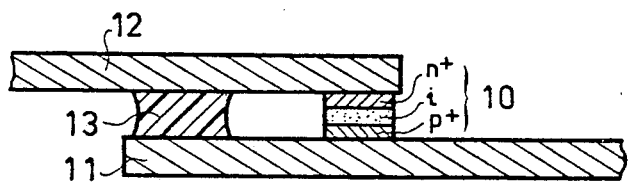
FIGS. 3, 4 and 5: a beam-lead diode of the invention, seen in section, a top view and its equivalent diagram.
Figure 4:
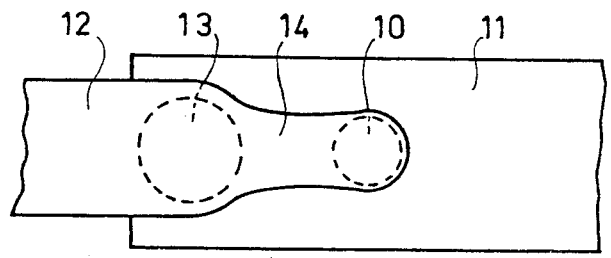
Figure 5:
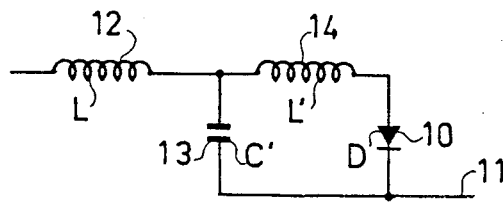

FIG. 3 shows a beam-lead diode in accordance with the invention, seen in section, whereas FIG. 4 shows the same diode in a top view and FIG. 5 gives the equivalent electric diagram of the diode of the invention.

It has been stated that the invention concerns practically all type of diodes, whether they are of PN junction, Schottky or PIN type: FIGS. 1 and 2 show Schottky diodes, FIGS. 3 and the following show PIN diodes without this in any way limiting the structure of the invention. If the diode mounted with beam-lead beams in accordance with the invention is a Schottky diode, only the steps for forming this diode change but the structure remains.

According to the invention, only the useful part of a diode is used, which means that the whole substrate volume which was only used in the prior art for supporting the junction properly speaking, and consequently the substrate surface which causes the appearance of one or more parasite capacities, is eliminated from the structure of the invention. In the text which follows, the whole of the semiconductor part of the diode will be designated by the reference 10: in the case of FIG. 3, diode 10 is then formed by the three PIN layers but, if the diode wre of a Schottky type, the assembly 10 would be formed by an n+ substrate, an N layer and a Schottky metal layer. Since diode 10 is thus reduced to the useful part alone, an anode beam 11 is connected to a main flat face of the diode, a cathode beam 12 is connected to the other main face of this same diode 10, the two main faces being of course the two flat faces of the two endmost layers. Since such a structure would be fragile, for the fact must be taken into account that the dimensions are reckoned in microns, the two beams 11 and 12 are mounted on the diode pastille 10 parallel to each other and one of the two beams, which is the anode beam 11 in the case of the figure, is extended so as to overlap the vertical projection of beam 12: at a certain distance from diode 10, beams 11 and 12 are consolidated and spaced apart by a glass stud 13 or more generally by a stud of a dielectric substance.

FIG. 4 which shows the didoe of FIG. 3 but seen from the top, clearly shows that the beams are wide so as to reduce the parasite inductance presented by each of these two electrical connections but, to reduce the parasite capacity of a first beam with respect to the second, beam 12 is reduced in width in its portion 14, between the glass stud 13 and diode 10.

FIG. 5 gives the equivalent diagram of the structure of FIGS. 3 and 4. Diode 10 is connected between a beam 11 and a beam 12 whose external portion 12 properly speaking presents a certain inductance L and whose portion 14 between the glass stud 13 and diode 10 has an inductance L'. The glass stud 13 forms with the two metal plates of beams 11 and 12 a parasite capacitor C'. In fact, this parasite capacitor is of a much lower value than the parasite capacitor or capacitors which were formed in a diode of the prior art such as shown in FIG. 1, and in addition it is possible to act on the diameter or the thickness of the glass stud as well as on the nature of the glass so as to give this parasite capacitor C' an acceptable value for diode 10.

By way of example, although these data in no wise form a limitation to the scope of the invention, the diode of FIG. 3 may be a silicon PIN diode with thin intrinsic zone, of a thickness of the order of 2 microns, for switching or limiting, at frequencies of the order of 75 to 100 GHz. The silicon pastille has a diameter of the order of 22 microns and a thickness of 10 microns so as to reduce the series/parasite resistance and have good heat dissipation. Such a silicon pastille is equivalent to a capacity of 0.02 pF. The glass stud 13 has a diameter of 70 microns, a thickness of 10 microns and if it is formed from glass whose dielectric constant $\epsilon=6$, it has a parasite capacity equal to 0.02 pF. The beams have a width of 125 microns, except portion 14 providing the connection between the glass stud 13 and the silicon pastille 10 which has a width reduced to 22 microns.

Figure 6:
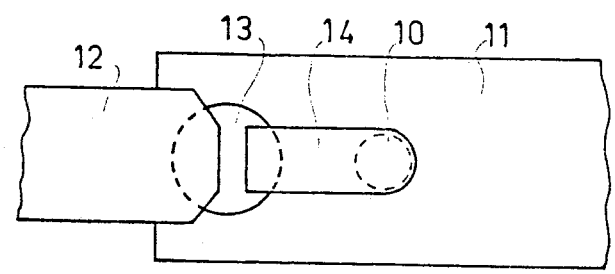
FIGS. 6 and 7: a beam-lead diode of the invention, in a variation, in a top view and its equivalent diagram.
Figure 7:
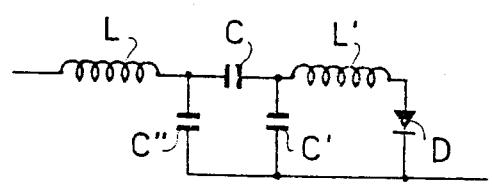

FIG. 6 shows in a top view a diode in accordance with the invention in a variant for improving it by introducing an additional parameter, and whose equivalent electric diagram is given in FIG. 7.

According to the variant of FIG. 6, beam 12, in its wide portion, is separated from the narrow portin 14 by interruption of the metal layer on the glass stud 13. This interruption may be linear, as is shown in FIG. 6, but it may also adopt other forms, so that for example portin 14 finishes on the glass stud 13 in a semi-circular pattern, whereas portion 12 of the beam forms a fork which surrounds the semi-circular portion of part 14. The important thing is that there should be a break in the metalization of the beams between these two portions 12 and 14, which in the electric diagram of FIG. 7 introduces a capacitor C, whose plates are the two ends of the beam portions 12 and 14 and those dielectric is the glass of stud 13. Since the beam is split into two portions 12 and 14, capacitor C40 formed by the two beams and the glass stud is itself also split into two capacitors C' and C", connected to the terminals of capacitor C. Capacitor C' is formed by the beam end 14, the glass stud 13 and the corresponding part of beam 11. Capacitor C" is formed by the end of beam 12, the glass stud 13 and the corresponding part of beam 11. Thus the capacitor C is formed by the beam lead 12, the glass stud 13 and the beam lead portion 14 while C' is formed by beam lead 11, glass stud 13 and beam lead portion 14 and capacitor C" is formed by beam lead 1, glass stud 13 and beam lead 12.

The advantage of this arrangement, and so of this structure is that an additional parameter is available for optimizing the operation of the diode. In fact, a diode may be likened to a resistance under direct biassing, and for the efficiency of the diode to be good, this resistance must be low; it may also be likened to a capacitor under reverse biassing and, in this case, it is iportant for the capacitor to have a low value so as to present a high impedance. The electric diagram of FIG. 7, the characteristics of the two parts of the beams whose inductances are L and L', and the characteristics of the glass stud may be adjusted to define the three parasite capacities C, C' and C", beam 11 being considered as being grounded. So, the structure of the two portions 12 and 14 of the cathode beam may be chosen so as to control the values of L, L', C, C' and C" so as to have, with direct biassing while neglecting C (very high): $L'(C''+C')\omega^2=1$. In this case, the component has a very high impedance at frequency $\omega/2\pi$, $\omega$ being the pulsation. With reverse biassing, if the capacity of the diode has for value $C'+C''$, the diode has a very low impedance.

In contrast to the diode shown in FIGS. 3 and 4, in which the cathode beam is formed in a single piece, the diode of FIG. 6, whose cathode beam is split into two portions, has the advantage that the value of the parasite capacitors C,C",C' may be adjusted. For example, by choosing a value of C which is too small during construction of the diode, it may then be increased by depositing a drop of varnish or dielectric material on the surface of the glass stud 13 and between the two beam ends 12 and 14. A value of C may also be chosen which is too high, that is to say that the two beam portions 12 and 14 are too close to one another, and the value of C may be reduced by laser machining. Similarly, the values C' and C" may be adjusted by the form given to the beam ends 12 and 14 as it is also possible to vary them by varying the thickness of the glass stud as will be seen further on, or by modifying the nature of the dielectric by changing the dielectric constant $\epsilon$.

Figure 8:
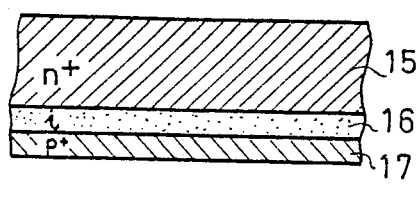
FIGS. 8 to 12: steps for manufacturing a diode of the invention.
Figure 12:
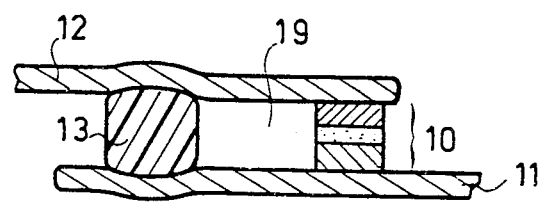

FIGS. 8 and 12 show the different principal steps for manufacturing a diode in accordance with the invention.

These different steps concern the manufacture of a PIN diode but if the diode to be produced were of another type such as a junction or Schottky diode, it would be sufficient to modify the steps concerning manufacture of the semiconductor properly speaking, by replacing for example the p type layer by a metal giving a Schottky contact.

Figure 9:
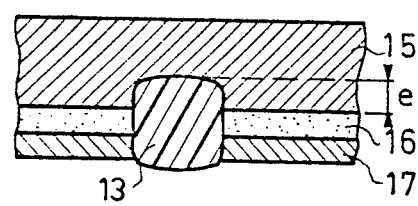

In FIG. 8, an n+ type substrate 15 is coated by epitaxy with a layer 16 of maximum resistivity and a p+ type layer 17, epitaxied or diffused: it is these three layers which will subsequently form the PIN diode. The assembly is then chemically etched from the face which supports the two epitaxied layers 16 and 17 so as to hollow out a caisson, to a depth "e" in substrate 15. The depth "e" hollowed out in the substrate corresponds to the desired thickness for the n layer of the PIN diode. The caisson is then filled with glass powder, which is then melted to give a glass stud 13 as is shown in FIG. 9.

Figure 10:
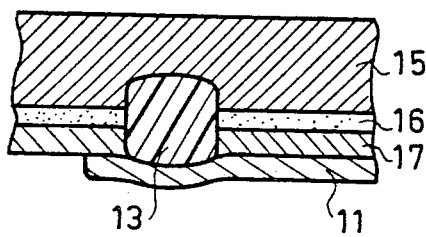
Figure 11:
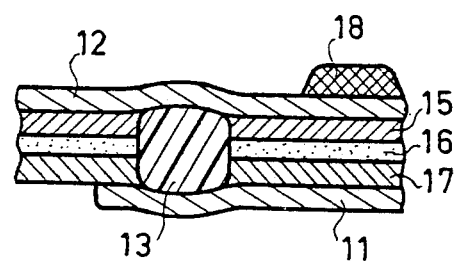

In FIG. 10, the lower beam 11 is formed by depositing SiPt-Ti-Pt-gold, by conventional known processes such as vacuum vaporization, photo-etching, electrolysis. Then the whole is bonded to a support, the bonding being effected on the beam 11 side so as to leave substrate 15 free. This latter is then thinned down, by processes which are also known such as aqueous or dry phase phasma etching, mechanical or mechanochemical erosion. Substrate 15 is thinned down sufficiently to reach the glass stud 13: there now remains of substrate 15 only a thickness corresponding to the thickness "e" such as it was defined in connection with FIG. 9, namely a thickness "e" equal to the thickness of the n+ layer forming the cathode of the PIN diode.

The next step consists in depositing on layer 15 a second metalization 12 which will form the second beam, the first beam 11 having been previously deposited on the other face of the device. This metalization 12 may be deposited by different processes known to a man skilled in the art, such as a general metalization folowed by etching or localized metalization which gives a beam 12 directly. Then a masking resin button 18 is deposited at the position where it is desired to obtain a diode mounted between the two beams 11 and 12. Referring to the preceding figures, and in particular to FIGS. 4 and 6, it is obvious that it is preferably to deposit the masking button 18 on the beam which has been thinned down, namely beam 12, the wider beam 12 serving both as base and heat sink for diode 10.

When the position of the diode has been determined, the semiconductor layers are eliminated, that is to say in the case described by way of example, the silicon layers 15, 16 and 17 in the zones situated outside the beams, and around the future diode 10 by chemical etching for example. This elimination is advantageously achieved in two steps, the first step corresponding to that where the maximum of semiconductor material must be removed and in particular betweent he two beams, in the underetching zone such as shown in FIG. 12. This first step is not very accurate, and eliminates the biggest part of the semiconductor material. In a second step, the chemical etching is more accurate and it literally cuts the diode out as well as finishing removal of any semiconductor material which might have remained during underetching in region 19 between the two beams. When this etching operation is finished, it only remains for the sides of the pastille 10 of the diode to be passivated by means of silica doped at low temperature, namely at a temperature less than or equal to 450°. FIG. 12 shows then a PIN diode 10 formed between a first beam 11 which bears on a first face of the diode and a second beam 12 which bears on a second face of the diode, the two beams 11 and 12 being spaced apart by a glass stud 13.

Figure 13:
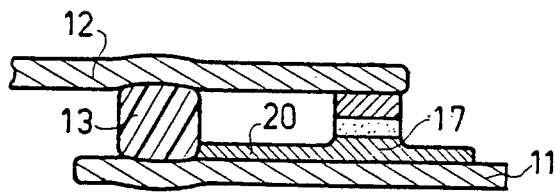
FIGS. 13 to 15: three variants of the structure of the diode of the invention.

FIG. 13 shows a first variant of the structure of a diode in accordance with the invention. It can be seen in this variant that a semiconductor material layer situated against one of the two beams has not been totally eliminated. In the case described by way of example, it is the p+ type layer 17 which has not been totally eliminated between the diode pastille properly speaking and the glass stud 13. The fact of maintaining a semiconductor material layer between the diode pastille and the glass stud allows more heat to be dissipated, since the silicon, or more generally the semiconductor material 20 is a better heat conductor than air and since the diode thus has a greater area in contact with a metal beam 11 which serves as a heat sink.

Figure 14:
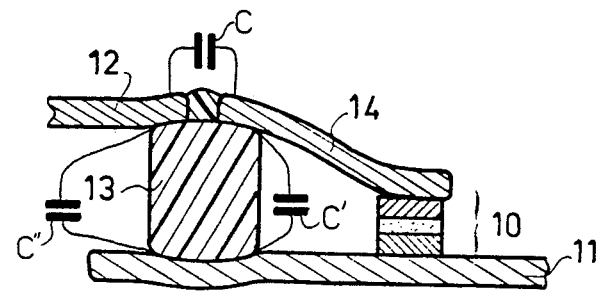
Figure 15:
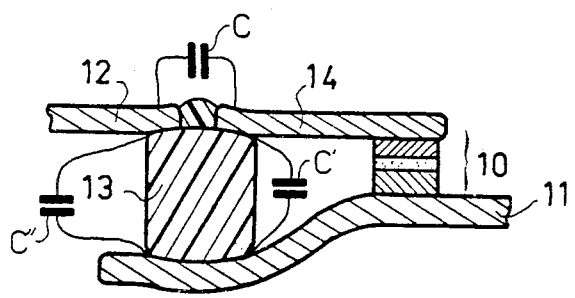

FIGS. 14 and 15 show two other variants of the structure of a diode in accordance with the invention. Whereas, in the figures of the constructional steps, from 8 to 12, and in FIG. 13 showing a first possible variant, beam 12 was shown monolithic, FIGS. 14 to 15 refer back to the case of FIG. 6 in which beam 12 may be split into two parts presenting therebetween a capacitive connection through a capacitor C.

With a view to forming a thicker glass stud, which will thus give parasite capacities C' and C" (cf FIG. 7) of lower values since the dielectric is thicker, we then have the case of a diode 10 of a certain thickness and a stud 13 which has a different thickness and generally greater since the thickness of diode 10 is of the order of 10 microns. In that case, since beam 11 is considered as base reference, the connection between the glass stud 13 and the diode pastille 10 which is not as high as the glass stud 13 is provided by means of a metal ribbon or wire 14. This is what is shown in FIG. 14. In FIG. 15, the reverse case has been taken and it is the cathode beam 12 and 14 which remains flat whereas the anode beam 11 is deflected so as to take up the difference in thickness between diode 10 and the glass stud 13. However, this construction is not as easy to put into practice, since beam 11 must at that time be heat welded to the glass stud and to the diode pastille, since it is no longer possible to obtain it directly by metal coating a silicon disk as was shown in FIG. 10.

In any case, the electric connection between the glass stud 13 and the diode pastille 10 may also be provided by thermo-compression of a gold wire or ribbon instead of the beam portion 14: although a wire causes a higher parasite inductance at the frequencies considered, the dimensions of the diode and of its connection 14 are so small that the inductance of a wire which is only a fiew tens of microns in length is acceptance in the operation of the diode of the invention.

The invention has been described with reference to the case of a silicon PIN diode but such reference, whose only purpose was to make the description clearer, in no wise limits the invention which relates to diodes generally, whether they are made from silicon or from a material from the families III-V such as GaAs for example, and whatever the structure of the diode. The important thing is, since it is the high frequencies up to 100 GHz or more which are considered, that the beams should have the smallest possible parasite capacity therebetween or with the substrate of the diode. Since the diode in accordance with the invention is limited to its active and useful part alone from the operating point of view, and sine all the parts having a mechanical role are eliminated, it only presents as parasite capacity between the beams the low capacity or capacities represented by the two beams and the glass stud.

What is claimed is:

1. A ultra-high frequency diode structure comprising:
   a diode chip having a first and a second principal face;
   a first and a second beam lead means offset from each other, said first beam lead means having a first portion and second portion and said second beam lead means having a first portion and a second portion wherein said diode is mounted between said first portion of said first beam lead means and said first portion of said second beam lead means said first portion of said first lead means being in contact with said first face and said first portion of said second lead means being in contact with said second face of said diode, said second portion of said first beam lead means being parallel to said second portion of said second beam lead means wherein said second portion of said first beam lead means extends from said first portion of said first beam lead means extends from said first portion of said first beam lead means in a first direction and said second portion of said second beam lead means extends from said first portion of said second beam lead means in a second direction opposite to said first direction;
   a glass stud separate from said chip wherein said glass stud is retained by said first portion of each of said first and second beam lead means and wherein said first portion of said first beam lead means includes a first section and a second section separate from said first section wherein one end of said first section contacts said glass stud and wherein one end of said second section contacts said glass stud and the other end of said second section contacts said first face of said chip;
   whereby the assembly of said first section, said second section, said second beam lead means and said glass stud form three adjustable coupling capacitors wherein one of said adjustable capacitors is formed by said first section, said second section and said glass stud and wherein said one of said capacitors is adjusted by metal abrasion by means of a laser on said one end of said first section and said one end of said second section.

2. A ultra-high frequency diode structure comprising:
   a diode chip having a first and a second principal face;
   a first and a second beam lead means offset from each other, said first beam lead means having a first portion and second portion and said second beam lead means having a first portion and a second portion wherein said diode is mounted between said first portion of said first beam lead means and said first portion of said second beam lead means said first portion of said first lead means being in contact with said first face and said first portion of said second lead means being in contact with said second face of said diode, said second portion of said first beam lead means being parallel to said second portion of said second beam lead means wherein said second portion of said first beam lead means extends from said first portion of said first beam lead means extends from said first portion of said first beam lead means in a first directon and said second portion of said second beam lead means extends from said first portion of said second beam lead means in a second direction opposite to said first direction;
   a glass stud separate from said chip wherein said glass stud is retained by said first portion of each of said first and second beam lead means and wherein said first portion of said first beam lead means includes a first section and a second section separate from said first section wherein one end of said first section contacts said glass stud and wherein one end of said second section contacts said glass stud and the other end of said second section contacts said first face of said chip;

whereby the assembly of said first section, said second section, said seecond beam lead means and said glass stud form three adjustable coupling capacitors wherein, one of said capacitors is formed by said first section, said second section and said glass stud and wherein when the value of said capacitor is too low, it may be adjusted by depositing a dielectric varnish between the two beam portions, on the glass stud.

* * * * *